(12) United States Patent
Hashimoto

(10) Patent No.: US 6,661,358 B1
(45) Date of Patent: Dec. 9, 2003

(54) DECODING VARIABLE LENGTH CODES WITHOUT CONDITIONAL BRANCHING

(75) Inventor: Roy T. Hashimoto, Redwood City, CA (US)

(73) Assignee: Enroute, Inc., Palo Alto, CA (US)

( * ) Notice: Subject to any disclaimer, the term of this patent is extended or adjusted under 35 U.S.C. 154(b) by 0 days.

(21) Appl. No.: 10/246,387

(22) Filed: Sep. 17, 2002

(51) Int. Cl.[7] ................................. H03M 7/40
(52) U.S. Cl. ............................. 341/67; 341/65
(58) Field of Search ..................... 341/65, 67

(56) References Cited

U.S. PATENT DOCUMENTS

| | | | | |
|---|---|---|---|---|
| 4,899,149 A | * | 2/1990 | Kahan ........................... | 341/67 |
| 5,181,031 A | * | 1/1993 | Tong et al. .................... | 341/65 |
| 5,208,593 A | * | 5/1993 | Tong et al. .................... | 341/65 |
| 5,254,991 A | * | 10/1993 | Ruetz et al. ................... | 341/65 |
| 6,219,457 B1 | * | 4/2001 | Potu ............................. | 382/246 |

* cited by examiner

*Primary Examiner*—Howard L. Williams
(74) *Attorney, Agent, or Firm*—Bever, Hoffman & Harms, LLP; Edward S. Mao

(57) ABSTRACT

A decoder decodes a binary input string encoded with a variable length code using an offset lookup table and a symbol lookup table. The decoder reads a first subset of leading bits from the binary input string and calculates an offset index value for the offset lookup table based on the first subset of leading bits. The offset index value is used to index the offset lookup table to obtain an offset value. Then, a symbol index value for the symbol lookup table is calculated from the offset value and a second subset of leading bits from the binary input string. The symbol index value is used to index the symbol lookup table to obtain a symbol, which corresponds to a third subset of leading bits of the binary input string.

30 Claims, 9 Drawing Sheets

| SYMBOL | FIXED LENGTH CODEWORD | VARIABLE LENGTH CODEWORD |
|---|---|---|
| A | "00" | "1" |
| B | "01" | "01" |
| C | "10" | "001" |
| D | "11" | "000" |

Fig. 1(a)

| SYMBOL STRING | ACAAABABDAA |
|---|---|
| FIXED LENGTH BINARY | 00100000000010001110000b |
| VARIABLE LENGTH BINARY STRING | 10011110110100011b |

Fig. 1(b)

| INDEX | SYMBOL |
|---|---|
| "00" | A |
| "01" | B |
| "10" | C |
| "11: | D |

310

| INDEX | SYMBOL | SIZE OF CODEWORD |
|---|---|---|
| 000b | D | 3 |
| 001b | C | 3 |
| 010b | B | 2 |
| 011b | B | 2 |
| 100b | A | 1 |
| 101b | A | 1 |
| 110b | A | 1 |
| 111b | A | 1 |

410

| INDEX | SYMBOL | SIZE OF CODEWORD |
|---|---|---|
| 00b | * | * |
| 01b | B | 2 |
| 10b | A | 1 |
| 11b | A | 1 |

| INDEX | SYMBOL | SIZE OF CODEWORD |
|---|---|---|
| 0b | D | 3 |
| 1b | C | 3 |

423— | 11 | 10110100011b |    ACA   —433

| INDEX | OFFSET | NUM_BITS |
|---|---|---|
| 0 | 0 | 3 |
| 1 | 0 | 3 |
| 2 | 1 | 2 |
| 3 | 2 | 1 |

| INDEX | SYMBOL | SIZE OF CODEWORD |
|---|---|---|
| 0 | D | 3 |
| 1 | C | 3 |
| 2 | B | 2 |
| 3 | A | 1 |

| SYMBOL | VARIABLE LENGTH CODEWORD |
|---|---|
| A | 1 |
| B | 010 |
| C | 011 |
| D | 0011 |
| E | 00100 |
| F | 00101 |

| INDEX | OFFSET | NUM_BITS |
|---|---|---|
| 0 | 0 | 0 |
| 1 | 0 | 0 |
| 2 | 0 | 0 |
| 3 | -4 | 5 |
| 4 | 2 | 3 |
| 5 | 5 | 1 |

| INDEX | SYMBOL | SIZE OF CODEWORD |
|---|---|---|
| 0 | E | 5 |
| 1 | F | 5 |
| 2 | D | 4 |
| 3 | D | 4 |
| 4 | B | 3 |
| 5 | C | 3 |
| 6 | A | 1 |

Fig. 6(c)

DECODING VARIABLE LENGTH CODES WITHOUT CONDITIONAL BRANCHING

FIELD OF THE INVENTION

The present invention relates variable length codes. More specifically, the present invention relates to encoding variable length codes so that the variable length codes can be decoded without using conditional branching.

BACKGROUND OF THE INVENTION

Variable length codes are most often used in various compression techniques to reduce the number of bits needed to store or transmit information formed from a set of symbols. For example, MPEG encoding uses variable length codes to reduce the number of bits required in a video stream. Variable length codes reduce the number of bits required for information by replacing frequently used symbols with short binary codes and only using long binary codes for infrequently used symbols. In general, most useful variable length codes are also prefix codes, i.e. no subset of any leading bits of a codeword is equivalent to another codeword.

FIGS. 1(a)–1(b) illustrates some of the benefits and detriments of using a fixed length code as compared to a variable length code for information having a set of 4 symbols A, B, C, and D. In FIG. 1(a), table 100 provides a fixed length code in column 114 and a variable length code in column 116 for the symbols A, B, C, and D in column 112. Specifically, symbols A, B, C, and D are represented as "00", "01", "10", and "11", respectively, in the fixed length code. To avoid confusion, binary numbers representing codewords are written within quotation marks and a binary number not representing a codeword includes a "b" at the end. In the variable length code, symbols A, B, C, and D are represented as "1", "01", "001", and "000", respectively. As illustrated in table 150 of FIG. 1(b), information represented by the symbols ACAAABABDAA is encoded as the 22 bit binary string 0010000000010001110000b using the fixed length code of FIG. 1(a). However, symbols ACAAABABDAA ca be encoded as a 17 bit binary string 10011110110100011b using the variable length code of FIG. 1(a). Thus, variable length encoding can be used to reduce the number of bits needed to represent information. For information using larger sets of symbols greater size reduction can be achieved using variable length encoding as long as some symbols are used more often than others.

While variable length codes reduce the number of bits required to store or transmit information, decoding of variable length codes is more complicated than decoding of fixed length codes. As illustrated in FIG. 2(a) decoding a fixed length code can be easily accomplished because each codeword has a fixed length so that a binary input string can be easily divided into individual codewords. Specifically, in FIG. 2(a) binary input string 0010000000010001110000b is separated into 11 2 bit codewords 210–220. Codewords 210–220 are "00", "10", "00", "00", "00", "01", "00", "01", "11", "00", and "00", respectively. Each Codewords is then translated using a simple lookup table such as table 250 FIG. 2(b). In table 250, the codewords are the index values used to retrieve the symbols. Specifically, in table 250, codewords "00", "01", "10", and "11" are translated into symbols A, B, C, and D, respectively. Thus, codewords 210–220 of FIG. 2(a) are translated into symbols 230–240, respectively. Specifically, symbols 230–240 are A, C, A, A, A, B, A, B, D, A, and A, respectively.

A common way to decode variable length codes is to create a lookup table that is indexed using a subset of the leading bits of the binary input string. Typically, the size of this subset is equal to the size of the longest codeword (i.e., number of bits in the longest codeword). For example, FIG. 3(a) illustrates a lookup table 310 that can be used to decode the variable length code of FIG. 1(a). Lookup table 310 is indexed by a 3 bit binary number, which is formed by the a subset of the three leading bits from the binary input string. Lookup table 310 provides the symbol and the size of the codeword that corresponds to each of the 3 bit binary numbers. Specifically, binary numbers 000b, 001b, 010b, 011b, 100b, 101b, 110b, and 111b correspond to symbols D, C, B, B, A, A, A, and A, respectively. Similarly, 3 bit binary numbers 000b, 001b, 010b, 011b, 100b, 101b, 110b, and 111b correspond to codewords of sizes 3, 3, 2, 2, 1, 1, 1, and 1, respectively.

FIG. 3(b) illustrates the use of table 310 to decode the 17 bit binary input string 10011110110100011b (321 in FIG. 3(b)). First the subset of the 3 leading bits (100b) of binary input string 321 is used as an index value in lookup table 310 (FIG. 3(a)). With index value 100b, lookup table 310 provides symbol A for decoded word 331. Lookup table 310 also provides that the size of the codeword corresponding to 100b is only 1 bit. Thus, the first bit of binary input string 321 is "consumed" in the decoding resulting in 16 bit binary input string 322 (0011110110100011b). The subset of the three leading bits of binary input string 322 (001b) is used as an index value in lookup table 310. With index value 0001b, lookup table 310 provides symbol C and a codeword size of 3 bits. Symbol C is added to decoded word 331 to form decoded word 332 (AC). Because the codeword size corresponding to index value 001b is 3, the first three bits of binary input string 322 are consumed and a 13 binary input string 323 (1110110100011b) remains to be decoded. The subset of the three leading bits of binary input string 323 (111b) is used as an index value to lookup table 310. With an index value of 111b, lookup table 310 provides symbol A and a codeword size of 1 bit. Symbol A is added to decoded word 332 to form decoded word 333 (ACA). Because the codeword size corresponding to 111b is 1, the first bit of binary input string 323 is consumed and a 12 bit binary input string 324 (1110110100011b) remains to be decoded. This process continues until all bits are consumed and the full decoded word (ACAAABABDAA) is obtained. As illustrated by lookup table 310, which includes eight entries, the size of the decoding lookup table is much larger than the number of symbols. Large lookup tables can reduce decoding performance in a variety of ways. For example, in a software implementation the decoding lookup table may not fit in the cache of a general purpose computer.

Another conventional method of decoding information encoded with variable length codes uses a primary lookup table with one or more secondary lookup tables. The primary lookup table is indexed using a first subset of leading bits of the binary input string that is less than the size of the largest codeword. Each set of bits is compared to one or more reserved values, which indicate that another secondary table should be used. Secondary tables can also include reserved values to indicate a tertiary table should be used. The secondary lookup tables are typically indexed using a second subset of bits following the first subset of leading bits from the binary input string. FIGS. 4(a)–4(c) illustrates this method. FIG. 4(a) includes primary lookup table 410 and FIG. 4(b) includes a secondary lookup table 420. Primary lookup table 410 is indexed using 2 bits of data. The index value 00b is a reserved value that indicates secondary lookup table 420 should be used. Index values 01b, 10b, and 11b correspond to symbols B, A, and A, respectively. Similarly, index values 01b, 10b, and 11b correspond to codewords of size 2, 1, and 1, respectively. Secondary lookup table 420 is only used if a subset of two leading bits of the binary input string is 00b. Secondary lookup table includes only two entries for index values of 0b, which corresponds to symbol D and codeword size of 3, and index value 1b, which corresponds to symbol C and codeword size of 3.

FIG. 4(c) illustrates the use of primary lookup table 410 and secondary lookup table 420 to decode the 17 bit binary input string 10011110110100011b (421 in FIG. 4(c)). First the subset of two leading bits (10b) of binary input string 421 are compared with 00b. Because 10b is not equal to 00b, 10b is used as the index value with primary lookup table 410, which provides Symbol A for decoded word 431. Primary lookup table 410 also provides that the size of the codeword corresponding to index value 10b is only 1 bit. Thus, the first bit of binary input string 421 is "consumed" and a 16 bit binary input string 422 (0011110110100011b) remains. The subset of two leading bits of binary input string 422 (00b) is compared with the reserved value 00b. Because 00b is a reserved value, a subset of 1 bit (1b) following the subset of two leading bits of the binary input string 422 (shown as binary input string 422a in FIG. 4(c)) is used as an index value to index secondary lookup table 420. For an index value of 1b, Secondary lookup table 420 provides symbol C and a codeword size of 3 bits. Symbol C is added to decoded word 431 to form decoded word 432 (AC). Because the codeword size corresponding to 1b is 3, the first three bits of binary input string 422a are consumed and a 13 bit binary input string 423 (1110110100011")remains to be decoded. The subset of two leading bits of binary input string 423 (11b) is compared to the reserved value 00b. Because 11b is not a reserved value, 11b is used to index primary lookup table 410, which provides symbol A and a size of 1 bit. Symbol A is added to decoded word 432 to form decoded word 433 (ACA). Because the codeword size corresponding to index value 111b is 1, the first bit of binary input string 323 is consumed and a 12 bit binary input string 424 (110110100011b)remains to be decoded. This process continues until all bits are consumed and the full decoded word (ACAAABABDAA) is obtained. The combined size of primary lookup table 410 and secondary lookup table 420 is less than the size of lookup table 310. Thus, the memory requirement used in the method using multiple lookup tables is generally less than the method using a single lookup table. However, the method using multiple lookup tables require the use of conditionals (e.g. "if" statements) to determine whether the initial index value corresponds to a reserved value. Conditionals can reduce decoding performance in modern processors in a variety of ways. For example, pipelined processors attempt to predict the results of a conditional statement. If the prediction is incorrect, the processor is stalled and the processor's pipeline must be cleared, which greatly reduces the performance of the processor. Hence, there is a need for a method to minimize the size of lookup tables without using conditional statements that may reduce performance.

SUMMARY

Accordingly, decoding an binary input string encoded using variable length codes in accordance with the present invention is accomplished using an offset lookup table and a symbol lookup table, which are generally smaller than a single lookup table, without the use of conditionals that may reduce the performance of a decoder. Specifically, in accordance with one embodiment of the present invention, decoding of a binary input string can be accomplished by reading a first subset of leading bits from the binary input string. Then, an offset index value for the offset lookup table is calculated based on the first subset of leading bits. The offset index value is used to index the offset lookup table so that an offset value is retrieved from the offset lookup table. Then, a symbol index value for the symbol lookup table is calculated from the offset value and a second subset of leading bits from the binary input string. The symbol corresponding to a third subset of leading bits form the binary input string is retrieved from the symbol lookup table.

Some embodiments of the present invention calculate the offset index value by calculating the most significant bit position of a binary state (i.e. 1b or 0b) of the first subset of leading bits. Other embodiments of the present invention calculate the offset index value by calculating the number of leading zeros or leading ones in the first subset of leading bits.

In some embodiments of the present invention, the offset lookup table also provides the size of the second subset of leading bits. For these embodiments the symbol index value is calculated by first converting the second subset of leading bits into an integer value. Then, the integer value of the second subset is added to the offset value to produce the symbol index value.

The present invention will be more fully understood in view of the following description and drawings.

BRIEF DESCRIPTION OF THE DRAWINGS

FIG. 1(a) is a table showing a fixed length code and a variable length code for a 4 symbol alphabet.

FIG. 1(b) shows how a symbol string is represented using the fixed length code and the variable length code.

FIG. 4(a) is a primary lookup table for decoding an input string encoded with a variable length code.

FIG. 4(b) is a secondary lookup table for decoding an input string encoded with a variable length code.

FIG. 4(c) illustrates the decoding of an input string encoded with a variable length code.

FIG. 5(a) is an offset lookup table in accordance with one embodiment of the present invention.

FIG. 5(b) is a symbol lookup table in accordance with one embodiment of the present invention.

FIG. 6(a) defines a variable length code.

FIG. 6(b) is an offset lookup table in accordance with one embodiment of the present invention.

FIG. 6(c) is a symbol lookup table in accordance with one embodiment of the present invention.

DETAILED DESCRIPTION

As explained above, methods of decoding binary input strings encoded with variable length codewords in accordance with the present invention do not require the use of conditionals. Specifically, methods of decoding in accordance with the present invention always use a two level lookup. First an offset lookup table is used to find an offset, which is used with the binary input string to index a symbol lookup table to determine the symbol corresponding to the current codeword and the size of the current codeword.

FIGS. 5(a)–5(f) illustrate decoding a binary input string encoded using the variable length code of FIG. 1(a) using an offset lookup table 510 and a symbol lookup table 520 in accordance with the present invention. Generation of offset lookup tables and symbol lookup tables in accordance with the present invention is described in detail below.

Figures 2A, 2B:
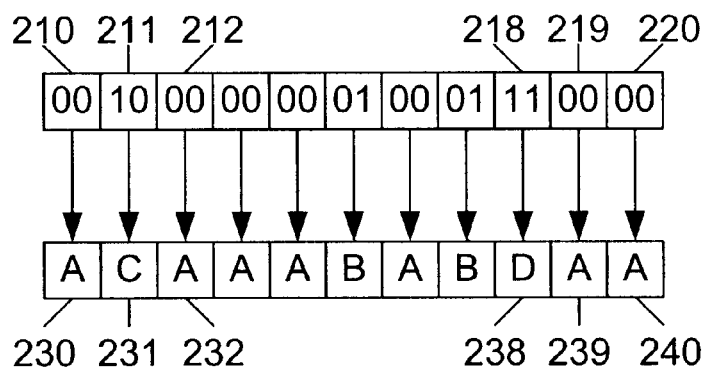
FIG. 2(a) illustrates the decoding of an input string encoded with a fixed length code.
FIG. 2(b) is a lookup table for decoding an input string encoded with a fixed length code.
Figures 3A, 3B:
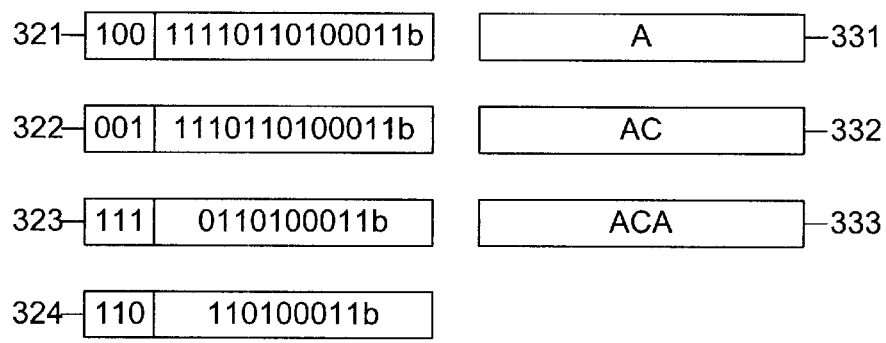
FIG. 3(a) is a lookup table for decoding an input string encoded with a variable length code.
FIG. 3(b) illustrates the decoding of an input string encoded with a variable length code.
Figure 5C:
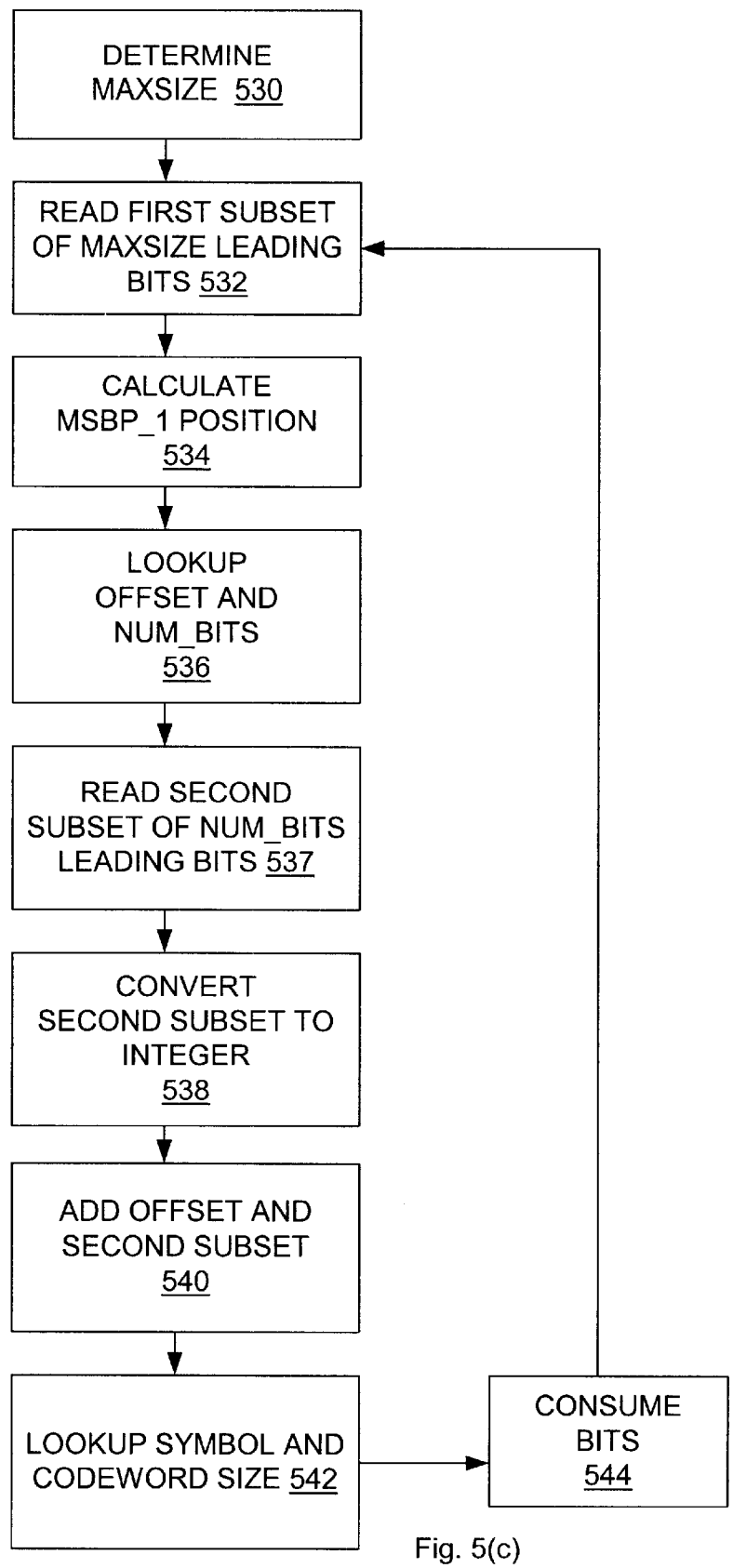
FIG. 5(c) is a flow diagram of a decoding method in accordance with one embodiment of the present invention.

FIG. 5(a) shows offset lookup table 510. Unlike the previous lookup tables, offset lookup table 510 is indexed with an integer value derived from the binary input string rather than with portions of the binary input string itself. Specifically, for the embodiment of FIGS. 5(a)–5(f) the index for offset lookup table 510 is the bit position of the most significant 1b. More specifically, the size of the largest codeword (MAXSIZE) of the variable length code is determined and the first subset of MAXSIZE leading bits of the binary input string is treated as a binary number. Then, the position of the most significant bit having a 1 is used as the index for offset table 510. For example, in the variable length code of FIG. 1(a) the maximum size of a codeword is three bits. If the input binary input string is 01001b, the first subset of three leading bits are treated as a binary number 010b and the bit position of the most significant 1b is used as an index value for offset table 510. In this case the most significant bit position containing a 1b in 010b is 2. If no bits contain a 1b zero is used as the index for offset table 510. The principles of the present invention can also be used in a method where the most significant bit position containing a 0b is used an index. However, for clarity the examples contained herein all use the most significant bit position containing a 1b. Furthermore, for variable length codes without an all zero codeword, the most significant bit position can begin with zero at the least significant bit rather than one.

Offset lookup table 510 provides an offset value and the number of lookup bits (NUM_BITS) from the binary input string to be used for generating the index of symbol lookup table 520 as described below. For index values of 0, 1, 2, and 3, offset lookup table 510 provides offset values of 0, 0, 1, and 2, respectively and number of lookup bits (NUM_BITS) of 3, 3, 2, 1, respectively.

Like offset lookup table 510, symbol lookup table 520 also uses an integer number as the index. For symbol lookup table 520, the index is calculated by taking a second subset of NUM_BITS leading bits of the binary input string, converting the second subset of leading bits into an integer value and adding the offset value obtained from offset lookup table 510. For example, if the binary input string is 11101b the offset and number of lookup bits from offset table 510 are 2 and 1, respectively. The second subset of one leading bit of 11101b is 1b, which is equivalent to an integer value of 1. Adding the offset value 2 to the integer value of the second subset of leading bits of 1 gives an index value of 3 for symbol lookup table 520. In symbol lookup table 520, index values of 0, 1, 2, and 3 correspond to symbols D, C, B, and A, and codeword sizes of 3, 3, 2, and 1.

FIG. 5(c) is a flow diagram of a method of decoding an input binary input string formed from a variable length code using an offset lookup table and a symbol lookup table in accordance with one embodiment of the present invention. First the size of the largest codeword (MAXSIZE) is determined in DETERMINE MAXSIZE step 530. Then, a first subset of MAXSIZE leading bits of the input binary input string are read as a single binary number in READ FIRST SUBSET OF MAXSIZE LEADING BITS step 532. Then, the most significant bit position containing a 1b (MSBP_1) of the first subset is calculated in CALCULATE MSBP_1 POSITION step 534. The most significant bit position containing a 1b (MSBP_1) is then used as an index value in offset lookup table 510 to determine the offset value and number of lookup bits (NUM_BITS) in LOOKUP OFFSET AND LOOKUP NUM_BITS step 536. A second subset of NUM_BITS leading bits of the binary input stream is formed in READ SECOND SUBSET OF NUM_BITS LEADING BITS step 537. The second subset of leading bits is converted into an integer value in CONVERT SECOND SUBSET TO INTEGER step 538. The offset value and the integer value of the second subset are added to obtain a symbol index value for symbol lookup table 520 in ADD OFFSET AND SECOND SUBSET step 540. The symbol index value is used in symbol lookup table 520 to obtain the symbol and codeword size in LOOKUP SYMBOL AND CODEWORD SIZE step 542. Then, the appropriate number of bits (i.e., the codeword size) are consumed from the binary input string in CONSUME BITS step 544. The remaining bits of the binary input string are then processed at READ FIRST SUBSET OF MAXSIZE LEADING BITS step 532 until all the bits of the binary input string have been consumed.

Figure 5D:
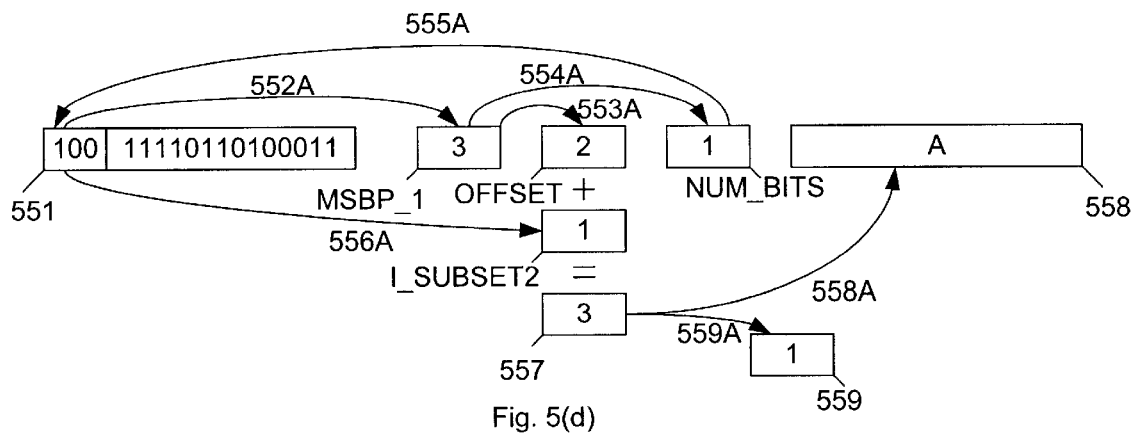
FIGS. 5(d), 5(e), and 5(f) illustrate decoding a binary input string in accordance with one embodiment of the present invention.
Figure 5E:
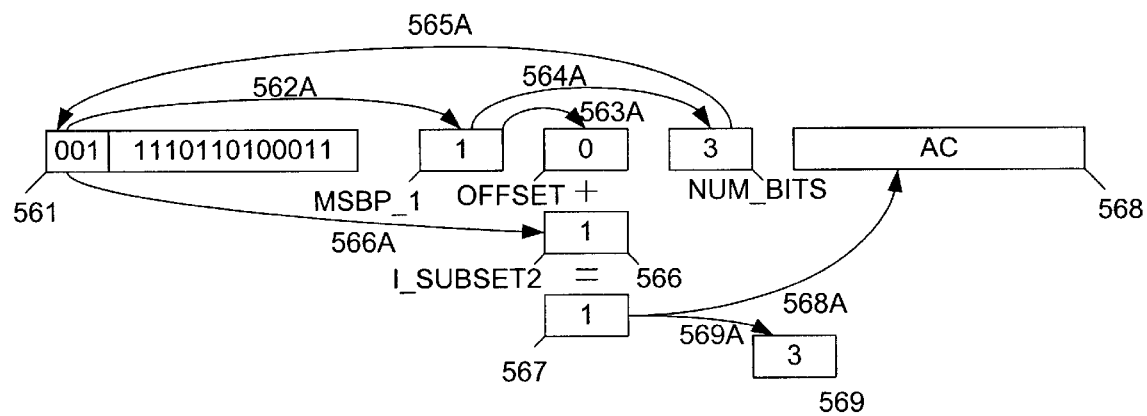
Figure 5F:
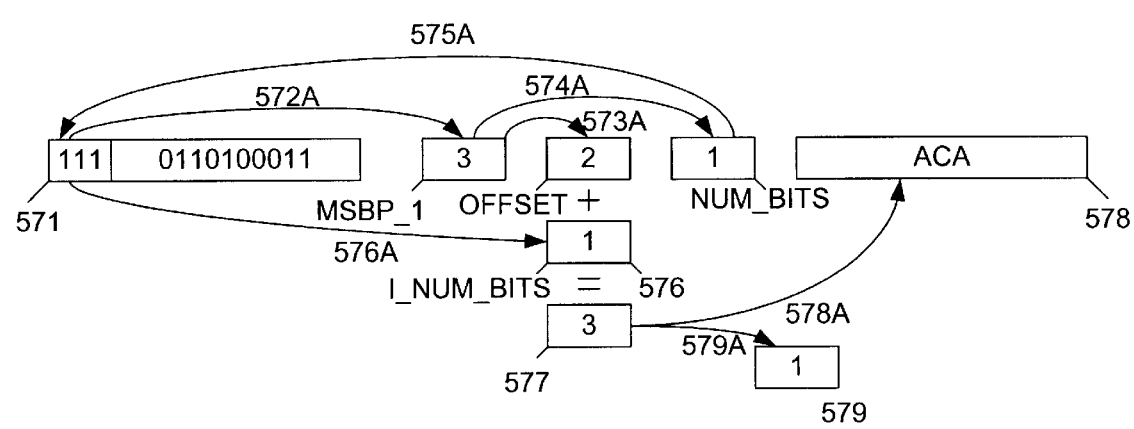

FIGS. 5(d)–5(f) illustrate the use of the method of FIG. 5(c) to decode the 17 bit binary input string 10011110110100011b (551 in FIG. 5(d)) which is encoded using the variable length code of FIG. 1(a). For the variable length code of FIG. 1(a), MAXSIZE, i.e. the size of the largest codeword, is three (DETERMINE MAXSIZE step 530). Thus, as indicated using arrow 552A, the first subset of three leading bits (100b) of binary input string 551 are used to determine the most significant bit position of a binary 1b (READ FIRST MAXSIZE BITS step 532). In this case the most significant bit position of a 1b (MSBP_1) equals 3 and provides the index value into offset lookup table 510 (CALCULATE MSBP_1 POSITION step 534). As indicated by arrow 553A and 554A, an index value of 3 in offset lookup table 510 provides an OFFSET of 2 and NUM_BITS of 1 (LOOKUP OFFSET AND NUM_BITS step 536). Then, as indicated by arrow 555A a second subset of NUM_BITS leading bits of binary input string 551 is formed (READ SECOND SUBSET OF NUM_BITS LEADING BITS step 537). As indicated by arrow 556A, the second subset of leading bits is converted to an integer value I_SUBSET2. (CONVERT SECOND SUBSET TO INTEGER step 538). In this case, the second subset of 1 leading bit of binary input string 551 is 1b and the integer value is equal to 1. The OFFSET, i.e. 2, is added to the integer value of the second subset (I_SUBSET2), i.e. 1, to get index value 557, which is equal to 3 (ADD OFFSET AND SECOND SUBSET step 540). As indicated by arrows 558A and 559A, index value 557 is used with symbol lookup table 520 to obtain symbol A for decoded word 558 and a codeword size 559 of 1 (LOOKUP SYMBOL AND CODEWORD SIZE step 542). Then, the codeword is consumed by removing the first bit of binary input string 551 to get binary input string 561 (FIG. 5(e)) which is 0011110110100011b (CONSUME BITS step 544).

FIG. 5(e) illustrates the decoding of binary input string 561. As indicated using arrow 562A, the first subset of three leading bits (001b) of binary input string 561 are used to determine the most significant bit position of a binary 1b (READ FIRST MAXSIZE BITS step 532). In this case the most significant bit position of a 1b (MSBP_1) equals 1 and provides the index value into offset lookup table 510 (CALCULATE MSBP_1 POSITION step 534). As indicated by arrow 563A and 564A, an index value of 1 in offset lookup table 510 provides an OFFSET of 0 and NUM_BITS of 3 (LOOKUP OFFSET AND NUM_BITS step 536). As indicated by arrow 55A, a second subset of NUM_BITS leading bits of binary input string 561 is formed. (READ SECOND SUBSET OF NUM_BITS LEADIGN BITS step 537). As indicated by arrow 566A the second subset of leading bits is converted to an integer value I_SUBSET2. (CONVERT SECOND SUBSET TO INTEGER step 538). In this case, the second subset of three leading bits of binary input string 561 is 001b and the integer value of the second subset (I_SUBSET2) is equal to 1. The offset value, i.e. 0, is added to the integer value of the second subset (I_SUBSET2), i.e. 1, to get index value 567, which is equal to 1 (ADD OFFSET AND I_SUBSET2 step 540). As indicated by arrows 568A and 569A, index value 567 is used with symbol lookup table 520 to obtain symbol C for decoded word 568 and a codeword size 569 of 3 (LOOKUP SYMBOL AND CODEWORD SIZE step 542). Then, the codeword is consumed by removing the first three bits of binary input string 561 to get binary input string 571 (FIG. 5(f)) which is 1110110100011b (CONSUME BITS step 544).

FIG. 5(f) illustrates the decoding of binary input string 571. As indicated using arrow 572A, the first subset of three leading bits (111b) of binary input string 571 are used to determine the most significant bit position of a binary 1b (READ FIRST MAXSIZE BITS step 532). In this case the most significant bit position of a 1b (MSBP_1) equals 3 and provides the index value into offset lookup table 510 (CALCULATE MSB POSITION step 534). As indicated by arrow 573A and 574A, an index value of 3 in offset lookup table 510 provides an OFFSET of 2 and NUM_BITS of 1 (LOOKUP OFFSET AND NUM_BITS step 536). As indicated by arrow 575A, a second subset of NUM_BITS leading bits binary input string 571 is formed (READ SECOND SUBSET OF NUM_BITS LEADING BITS step 537). As indicated by arrow 576A, the second subset is converted to an integer value I_SUBSET2. (CONVERT NUM_BITS TO INTEGER step 538). In this case, the second subset of 1 leading bit of binary input string 571 is 1b and the integer value is equal to 1. The offset value, i.e. 2, is added to the integer value of the second subset (I_SUBSET2), i.e. 1, to get index value 577, which is equal to 3 (ADD OFFSET AND I_SUBSET2 step 540). As indicated by arrows 578A and 579A, index value 577 is used with symbol lookup table 520 to obtain symbol A for decoded word 578 and a codeword size 579 of 1 (LOOKUP SYMBOL AND CODEWORD SIZE step 542). Then, the codeword is consumed by removing the first bit of binary input string 571 to get a binary input string of 110110100011b (CONSUME BITS step 544). This method continues until all bits of the binary input string are consumed.

Offset lookup table 510 and symbol lookup table 520 are generated from the variable length code of FIG. 1(a). Table 1 (below) provides a pseudo code implementation of a method to generate offset lookup table 510 and symbol lookup table 520. Comments in Table 1 are set off by single quotation marks, e.g. 'comments'.

TABLE 1

```
MAXSIZE=(size of largest codeword);
NUM_ENTRIES_O=0; 'Number of entries in offset lookup table'
NUM_ENTRIES_S=0; 'Number of entries in symbol lookup table'
LEAD0s=MAXSIZE; 'LEAD0s is a loop variable'
While LEAD0S >= 0 {
    Find a set SET[LEAD0S] of all codewords with
            LEAD0S leading zeros {
    MAXLENGTH=(size of largest codeword in SET[LEAD0S]);
    MINVALUE=INFINITY; 'MINVALUE is the zero extended
            Minimum Value of the codewords in SET[LEAD0S]'
    MAXVALUE=0; 'MAXVALUE is the one extended maximum
            Value of the codewords in SET[LEAD0S]'
    For each CODEWORD in SET[LEAD0S] {
        TEMPMIN=CODEWORD;
        TEMPMAX=CODEWORD;
        IF size of CODEWORD < MAXLENGTH THEN
            PADD 0s to TEMPMIN; 'Extend the size of TEMPMIN
                to MAXLENGTH by padding with zeroes'
            PADD 1s to TEMPMAX; 'Extend the size of TEMPMAX
                to MAXLENGTH by padding with ones'
        IF TEMPMIN<MINVALUE then MINVALUE=TEMPMIN;
        IF TEMPMAX>MAXVALUE then MAXVALUE-TEMPMAX;
    }
    IF SET[LEAD0s] is empty then MINVALUE=0;
    IF SET[LEAD0s] is empty then MAXLENGTH=0;
    ADD an entry to offset lookup table
        INDEX=NUM_ENTRIES_O;
        OFFSET=NUM_ENTRIES_S-MINVALUE;
        NUM_BITS=MAXLENGTH;
    NUM_ENTRIES_O=NUM_ENTRIES_O + 1;
    IF SET[LEAD0S] is not empty
        FOR VALUE=MINVALUE to MAXVALUE {
```

TABLE 1-continued

```
            ADD an entry to SYMBLE lookup table
                INDEX=NUM_ENTRIES_S;
                SYMBOL=the symbol corresponding to leading bits
                    of VALUE; 'the binary representation of VALUE
                                using MAXLENGTH number of bits is
                                used to find the symbol'
                SIZE OF CODEWORD= the size of the codeword for the
                    Symbol;
                NUM_ENTRIES_S=NUM_ENTRIES_S +1
                }
        LEAD0S=LEAD0S−1
    }
```

For further clarification, the pseudo code implementation of table 1 is applied to the variable length code of table 600 (FIG. 6(*a*)) to generate an offset lookup table 610 (FIG. 6(*b*)), and symbol lookup table 620 (FIG. 6(*c*)). The variable length code of Table 600 uses 6 symbols A, B, C, D, E, and F with corresponding binary codewords "1", "010", "011", "0011", "00100", and "00101", respectively.

MAXSIZE is equal to five because the largest codeword in the variable length code of table 600 is "00100" and "00101" corresponding with symbols E and F, respectively. When LEAD0S is equal to 5, SET[5], i.e. the set of all codewords with LEAD0S (i.e. 5) leading zeroes, contains zero codewords. Thus, the sections dealing with the codewords in SET[5] are skipped. However, an entry to offset lookup table 610 is still performed. Specifically, the index value to be added is equal to NUM_ENTRIES_O, which equal zero. The offset value is equal to NUM_ENTRIES_S−MINVALUE. Both NUM_ENTRIES_S and MINVALUE are equal to zero. Thus the offset value is also zero. The NUM_BITS value is equal to MAXLENGTH. Because there are no codewords in SET[5], MAXLENGTH is equal to 0. Thus an entry at index value 0, with offset value equal to 0 and NUM_BITS equal to 0 is added to offset lookup table 610. NUM_ENTRIES_O is incremented to be equal to 1. No entries are made to symbol lookup table 620, when no codewords are in SET[LEAD0S].

Similarly, when LEAD0S is equal to 4, SET[4] contains zero codewords. Thus, an entry at index value 1, with offset value equal to 0 and NUM_BITS equal to 0 is added to offset lookup table 610. NUM_ENTRIES_O is incremented to be equal to 2.

Furthermore, when LEAD0S is equal to 3, SET[3] contains zero codewords. Thus, an entry at index value 2, with offset value equal to 0 and NUM_BITS equal to 0 is added to offset lookup table 610. NUM_ENTRIES_O is incremented to be equal to 3.

When LEAD0S is equal to 2, SET[2] includes codewords "0011", "00100", and "00101". MAXLENGTH is equal to 5 because the size of codewords "00100" and "00101" is 5. Next MINVALUE and MAXVALUE is determined for SET[2]. MINVALUE is set equal to infinity and MAXVALUE is set equal to 0. Both TEMPMIN and TEMPMAX are set equal to codeword "0011". Because the size of codeword "0011" is less than MAXLENGTH (i.e. 5), TEMPMIN is padded to 5 bits by adding zeros. Accordingly, TEMPMIN becomes 00110b which is equal to integer value of 5. However, TEMPMAX is padded to 5 bits by adding ones. Accordingly TEMPMAX becomes 00111b which is equal to an integer value of 7. Because TEMPMIN is less than MINVALUE, MINVALUE is set equal to TEMPMIN. Thus MINVALUE is now equal to 5. Similarly, TEMPMAX is greater than MAXVALUE; therefore, MAXVALUE is set equal to TEMPMAX. Thus, MAXVALUE is now equal to 7.

The next codeword in SET[2] is codeword "00100". TEMPMIN and TEMPMAX are both set equal to 00100b. Because codeword "00100" has a size of 5, padding of TEMPMIN and TEMPMAX are not required. Thus, TEMPMIN and TEMPMAX have integer value of 4. Because TEMPMIN is less than MINVALUE, MINVALUE is set equal to TEMPMIN. Thus, MINVALUE is now equal to 4. However, MAXVALUE is greater than TEMPMAX. Therefore, MAXVALUE remains 7.

The next codeword in SET[2] is codeword "00101". TEMPMIN and TEMPMAX are both set equal to 00101b. Because codeword "00101" has a size of 5, padding of TEMPMIN and TEMPMAX are not required. Thus, TEMPMIN and TEMPMAX have integer value of 5. Because TEMPMIN is greater than MINVALUE, MINVALUE remains 4. Similarly, because MAXVALUE is greater than TEMPMAX, MAXVALUE remains 7.

An entry to offset lookup table 610 is made based on MINVALUE and MAXLENGTH. Specifically, the index value to be added is equal to NUM_ENTRIES_O, which equal three. The offset value is equal to NUM_ENTRIES_S−MINVALUE. NUM_ENTRIES_S is equal to zero and MINVALUE is equal to 4. Thus the offset value is −4. The NUM_BITS value is equal to MAXLENGTH, which is equal to 5. Thus an entry with index value 3, offset −4, and NUM_BITS 5 is added to offset lookup table 610. NUM_ENTRIES_0 is incremented by 1 to be equal to 4.

Because SET[2] was not empty, variable VALUE is set to loop from MINVALUE to MAXVALUE. An entry to symbol lookup table 620 with index value equal NUM_ENTRIES_S is added for each instance of VALUE. VALUE begins at MINVALUE, which is equal to 4 and will increment by one until VALUE equals MAXVALUE, which is equal to 7. When VALUE is equal to 4, the binary representation of VALUE using 5 bits is equal to 00100b. "00100" is the codeword for the symbol E and has a size of 5. Thus an entry with index value 0, symbol equal to E, and size of codeword equal to 5 is added to symbol lookup table 620. NUM_ENTRIES_S is incremented by 1 and is now equal to 1. VALUE is also incremented by 1 to be equal to 5, which has a five bit binary representation of 00101b.

"00101" is the codeword for the symbol F and has a size of 5. Thus an entry with index value 1 (i.e., NUM_ENTRIES_S), symbol equal to F, and size of codeword equal to 5 is added to symbol lookup table 620. NUM_ENTRIES_S is incremented by 1 and is now equal to 2. VALUE is also incremented by 1 to be equal to 6, which has a five bit binary representation of 00110b. The first four bits of 00110b is "0011" which is the codeword for the symbol D and has a size of 4. Thus an entry with index value 2 (i.e., NUM_ENTRIES_S), symbol equal to D, and size of codeword equal to 4 is added to symbol lookup table 620.

NUM_ENTRIES_S is incremented by 1 to be equal to 3. VALUE is also incremented by 1 to be equal to 7, which has a five bit binary representation of 00111b. The first four bits of 00111b is "0011", which is the codeword for the symbol D and has a size of 4. Thus an entry with index value 3 (i.e., NUM_ENTRIES_S), symbol equal to D, and size of codeword equal to 4 is added to symbol lookup table 620. NUM_ENTRIES_S is incremented by 1 to be equal to 4.

After VALUE is equal to MAXVALUE, LEAD0S is decremented by 1 to be equal to 1. SET[1] includes all the codewords having 1 leading zero. Thus, SET[1] includes codewords "010" and "011". MAXLENGTH is equal to 3 because the size of codewords "010" and "011" is 3. Next MINVALUE and MAXVALUE is determined for SET[1]. MINVALUE is set equal to infinity and MAXVALUE is set equal to 0. Both TEMPMIN and TEMPMAX are set equal to codeword "010". Because codeword "010" has a size of 3, padding of TEMPMIN and TEMPMAX are not required. Thus, TEMPMIN and TEMPMAX have integer value of 2. Because TEMPMIN is less than MINVALUE, MINVALUE is set equal to TEMPMIN. Thus, MINVALUE is now equal to 2. Because TEMPMAX is greater than MAXVALUE, MAXVALUE is set equal to TEMPMAX. Therefore, MAXVALUE is set equal to 2.

The next codeword in SET[1] is codeword "011". TEMPMIN and TEMPMAX are both set equal to 011b. Because codeword "011" has a size of 3, padding of TEMPMIN and TEMPMAX are not required. Thus, TEMPMIN and TEMPMAX have integer value of 3. Because TEMPMIN is greater than MINVALUE, MINVALUE remains 2. However, because TEMPMAX is greater that MAXVALUE, MAXVALUE is set equal to TEMPMAX. Thus, MAXVALUE is set equal to 3.

An entry to offset lookup table 610 is made based on MINVALUE and MAXLENGTH. Specifically, the index value to be added is equal to NUM_ENTRIES_O, which equal four. The offset value is equal to NUM_ENTRIES_S−MINVALUE. NUM_ENTRIES_S is equal to four and MINVALUE is equal to 2. Thus the offset value is 2. The NUM_BITS value is equal to MAXLENGTH, which is equal to 3. Thus an entry with index value 4, offset 2, and NUM_BITS 3 is added to offset lookup table 610. NUM_ENTRIES_0 is incremented by 1 to be equal to 5.

Because SET[1] was not empty, variable VALUE is set to loop from MINVALUE to MAXVALUE. An entry to symbol lookup table 620 with index value equal NUM_ENTRIES_S is added for each instance of VALUE. VALUE begins at MINVALUE, which is equal to 2 and will increment by one until VALUE equals MAXVALUE, which is equal to 3. When VALUE is equal to 2, the binary representation of VALUE using 3 bits is equal to 010b. "010" is the codeword for the symbol B and has a size of 3. Thus an entry with index value 4, symbol equal to B, and size of codeword equal to 3 is added to symbol lookup table 620. NUM_ENTRIES_S is incremented by 1 and is now equal to 5. VALUE is also incremented by 1 to be equal to 3, which has a three bit binary representation of 011b.

"011" is the codeword for the symbol C and has a size of 3. Thus an entry with index value 5 (i.e., NUM_ENTRIES_S), symbol equal to C, and size of codeword equal to 3 is added to symbol lookup table 620. NUM_ENTRIES_S is incremented by 1 and is now equal to 6.

After VALUE is equal to MAXVALUE, LEAD0S is decremented by 1 to be equal to 0. SET[0] includes all the codewords having 0 leading zero. Thus, SET[0] includes only codeword "1", which corresponds to symbol A. MAXLENGTH is equal to 1 because the size of codeword "1" is 1. Next MINVALUE and MAXVALUE is determined for SET[0]. MINVALUE is set equal to infinity and MAXVALUE is set equal to 0. Both TEMPMIN and TEMPMAX are set equal to codeword "1". Thus, TEMPMIN and TEMPMAX are both set equal to 1b. Because codeword 1 has a size of 1, padding of TEMPMIN and TEMPMAX are not required. Thus, TEMPMIN and TEMPMAX have integer value of 1. Because TEMPMIN is less than MINVALUE, MINVALUE is set equal to TEMPMIN. Thus, MINVALUE is now equal to 1. Because TEMPMAX is greater than MAXVALUE, MAXVALUE is set equal to TEMPMAX. Therefore, MAXVALUE is set equal to 1.

An entry to offset lookup table 610 is made based on MINVALUE and MAXLENGTH. Specifically, the index value to be added is equal to NUM_ENTRIES_O, which equal 5. The offset value is equal to NUM_ENTRIES_S−MINVALUE. NUM_ENTRIES_S is equal to six and MINVALUE is equal to 1. Thus the offset value is 5. The NUM_BITS value is equal to MAXLENGTH, which is equal to 1. Thus an entry with index value 5, offset 5, and NUM_BITS 1 is added to offset lookup table 610. NUM_ENTRIES_0 is incremented by 1 to be equal to 6.

Because SET[0] was not empty, variable VALUE is set to loop from MINVALUE to MAXVALUE. An entry to symbol lookup table 620 with index value equal NUM_ENTRIES_S is added for each instance of VALUE. VALUE begins at MINVALUE, which is equal to 1 and will increment by one until VALUE equals MAXVALUE, which is also equal to 1. When VALUE is equal to 1, the binary representation of VALUE using 1 bits is equal to 1b. "1" is the codeword for the symbol A and has a size of 1. Thus an entry with index value 6, symbol equal to A, and size of codeword equal to 1 is added to symbol lookup table 620. NUM_ENTRIES_S is incremented by 1 and is now equal to 7. Since LEAD0S is already at zero, Offset lookup table 610 and symbol lookup table 620 are complete.

Offset lookup table 610 and symbol lookup table 620 can be used to decode a binary input string encoded using the variable length code of table 600 in the manner described above.

In a second embodiment of the present invention, rather than storing NUM_BITS in offset lookup tables, a shift value is stored. The shift value is equal to the number of bits to right shift the binary input string to have the correct number of bits to use the symbol lookup table. In general, the shift value is equal to the size of the largest codeword minus the largest codeword in SET[LEAD0S], from the pseudo code implementation of TABLE 1, i.e. SHIFT=MAXSIZE−MAXLENGTH. APPENDIX I provides a C++ program that generates offset lookup tables and symbol lookup tables using a shift value.

Some variable length codes use predominantly leading ones rather than leading zeros. For these codes, using the most significant bit position of zeros rather than ones to generate offset lookup tables and symbol lookup tables may result in more compact tables. Thus, many embodiments of the present invention use most significant bit positions of zeros. For versatility, some embodiments of the present invention can use the most significant bit position of either binary state zero or binary state one. Alternatively, some embodiments of the present invention may perform bit-wise inversion of the codewords to generate the offset lookup tables and the symbol lookup tables. During decoding, the binary input string is also inverted.

In another embodiment of the present invention, rather than using the most significant bit position of a binary 1b as the index values for the offset lookup table, the index values for the offset lookup table is determined by the number of leading zeros in the first subset of leading bits. Because there is a fixed relationship between the number of leading zeros in the first subset of leading bits and the most significant bit position of 1b, these embodiments perform very similarly to the embodiments described above. Specifically, the most significant bit position of 1b (MSBP_1) is equal to the size of the largest codeword (MAXSIZE) minus the number of leading zeros. When using the number of leading zeros, the offset lookup table would be in reverse order as compared to using the most significant bit position of 1b. Other embodiments may also use the number of leading 1s as the index value of the offset lookup table.

Figure 7:
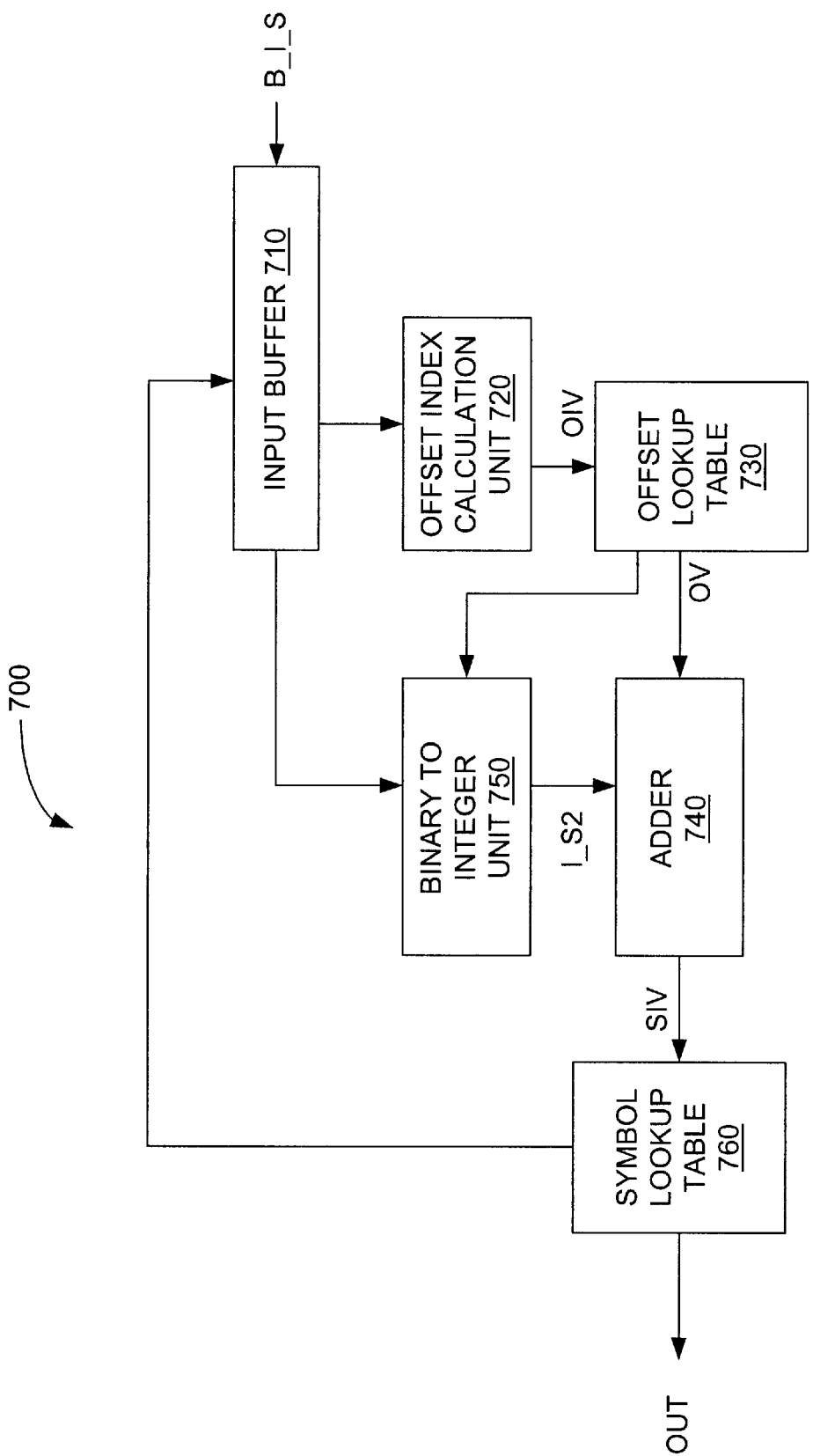
FIG. 7 is a block diagram of a decoder in accordance with one embodiment of the present invention.

FIG. 7 is a block diagram of a decoder 700 in accordance with one embodiment of the present invention. Decoder 700 includes an input buffer 710, an offset index calculation unit 720, an offset lookup table 730, an adder 740, a binary to integer unit 750, and a lookup table 760. Input buffer 710 receives a binary input string B_I_S. Offset index calculation unit 720 calculates an offset index value OIV from a first subset of leading bits of input buffer 710. Offset index value OIV is used to index offset lookup table 730, which provides an offset value OV to adder 740.

In some embodiments of decoder 700, offset lookup table 730 provides the number of lookup bits (N_B) to be used for generating the symbol index value of symbol lookup table 760 to binary to integer unit 750. In these embodiments binary to integer unit 750 reads a second subset of N_B leading bits from input buffer 710 and converts the second subset into an integer value I_S2, which is provided to ADDER 740. In other embodiments of decoder 700, offset lookup table 730 provides a shift value to binary to integer unit 750. In these embodiments, binary to integer unit 750 shifts the first subset of leading bits by the shift value to form the second subset and then converts the second subset to integer value I_S2.

ADDER 740 adds integer value I_S2 and offset value OV to generate symbol index value SIV, which is used to index symbol lookup table 760. Symbol lookup table provides an output symbol OUT and a codeword size CS. Codeword size CS is provided to input buffer 710, which consumes the CS leading bits in input buffer 710. Decoder 700 performs as described unit all the bits in binary input string B_I_S are consumed.

In some embodiments of the present invention, offset index calculation unit 720 is a MSBP Calculation unit, which is configured to calculate the most significant bit position of a binary state, such as 1b or 0b. In other embodiments of the present invention, offset index calculation unit 720 is a leading zeros calculation unit or a leading ones calculation unit. A leading zeros calculation unit calculates the number of leading zeros in the first subset of leading bits. Conversely, a leading ones calculation unit calculates the number of leading ones in the first subset of leading bits.

Some embodiments of Decoder 700 are implemented on a general purpose computer. In these embodiments, input buffer 710, symbol lookup table 760 and offset lookup table 730 are stored in the computer's memory system. Offset index calculation unit 720, binary to integer unit 750, and adder 740 can be software instructions stored in the computer's memory system and executed in the computer's processors. Alternatively, offset calculation unit 720, binary to integer unit 750, and adder 740 may be special functions provided directly by the processor. For example, the Pentium™ family of microprocessors from Intel include a bsr instruction which provides the most significant bit position of a 1b in a binary string.

In the various embodiments of this invention, novel structures and methods have been described to decode variable length codes. By using an offset lookup table with a symbol lookup table, the overall size of the lookup tables needed for decoding binary input string is reduced. Furthermore, the principles of the present invention allow decoding without the use of conditionals to further enhance the performance of a decoder. The various embodiments of the structures and methods of this invention that are described above are illustrative only of the principles of this invention and are not intended to limit the scope of the invention to the particular embodiments described. For example, in view of this disclosure, those skilled in the art can define other decoders, encoders, lookup tables, offset lookup tables, symbol lookup tables, variable length codes, offset index calculation units, binary to integer units, and so forth, and use these alternative features to create a method or system according to the principles of this invention. Thus, the invention is limited only by the following claims.

APPENDIX I

Copyright © 2001–2002 Enroute Inc.
All Rights Reserved

```
#pragma warning (disable:4786)
#include <cstdlib>
#include <algorithm>
#include <iostream>
#include <fstream>
#include <list>
#include <limits>
#include <string>
#include <vector>
using namespace std;
// VLC and table data pair
struct CodeEntry
{
    CodeEntry(const string& __code,const string& __data)
    : code(__code), data(__data)
    {}
    const string code;
    const string data;
```

APPENDIX I-continued

Copyright © 2001–2002 Enroute Inc.
All Rights Reserved

```
};
// compare strings only through the length of the shorter string
struct CodeMatch
{
    const string& s;
    CodeMatch(const string& _s) : s(_s) {}
    bool operator() (const CodeEntry& entry) const
    {
        const int size0 = s.length();
        const int size1 = entry.code.length();
        const int min_size = size0 < size1 ? size0 : size1;
        return !s.compare(0,min_size,entry.code,0,min_size);
    }
};
struct TableEntry
{
    TableEntry(const int _offset,const int _shift)
    : offset(_offset), shift(_shift)
    {}
    const int offset;
    const int shift;
};
// return number of leading zeros in a string
int count_leading_zeros(const string& s)
{
    int rval = 0;
    for ( string::const_iterator i = s.begin(); i != s.end(); ++i )
    {
        if ( *i == '0' )
            ++rval;
        else
            break;
    }
    return rval;
}
// return value of a binary string when zero-extended to n bits
int extended_zero(const string& s,int n)
{
    int rval = 0;
    for ( string::const_iterator i = s.begin(); i != s.end();
                ++i )
    {
        // shift current value
        rval <<= 1;
        // set bit
        if ( *i == '1' )
            rval |= 1;
        // decrement n
        --n;
    }
    // shift out remaining bits
    return rval << n;
}
// return value of a binary string when one-extended to n bits
int extended_one(const string& s,int n)
{
    int rval = 0;
    for ( string::const_iterator i = s.begin(); i != s.end();
                ++i )
    {
        // shift current value
        rval <<= 1;
        // set bit
        if ( *i == '1' )
            rval |= 1;
        // decrement n
        --n;
    }
    // shift out remaining bits
    return (rval << n) | ((1 << n) - 1);
}
// convert integer to binary string representation
string binary_to_string(const int value,const int n)
{
    string result;
    for ( int i = n - 1; i >= 0; --i )
```

APPENDIX I-continued

Copyright © 2001–2002 Enroute Inc.
All Rights Reserved

```
    {
        if ( value & (1 << i) )
            result += '1';
        else
            result += '0';
    }
    return result;
}
typedef list<CodeEntry> CodeList;
typedef vector<CodeList *> CodeArray;
typedef list<TableEntry> TableList;
main(int argc,char **argv)
{
    const char *tablename = argc > 1 ?
        argv[1] :
        "table";
    //
    CodeArray codearray;
    // set up input state machine
    enum {
        skip_to_vlc,    // consume whitespace before code
        read_vlc,       // read code up to a tab
        skip_to_data,   // consume whitespace before lookup data
        read_data,      // read data up to a newline
        error
    } state = skip_to_vlc;
    // table entry
    string code;
    string data;
    // find longest code
    int longest = 0;
    // determine if any code has all zeros
    // The IA instruction bsr is undefined for an all-zero
        // argument. Therefore, if any code is all zeros an extra
        // 1-bit must be shifted in before proceeding. If an
        // all-zero code is found, this flag is set and the tables
        // are adjusted accordingly.
    bool allzero = false;
    int line = 1;
    bool comment = false;
    while ( state != error )
    {
        // read an input character
        const char c = cin.get();
        if ( !cin )
            break;
        if ( c == '#' )
            comment = true;
        if ( c == '\n' )
        {
            comment = false;
            ++line;
        }
        else if ( comment )
            continue;
        // execute within the current state
        switch ( state )
        {
        case skip_to_vlc:
            // continue in this state until non-whitespace
            if ( !isspace(c) )
            {
            // read this character again in the next state
                cin.putback(c);
            // erase code and data strings for a new entry
                code.erase();
                data.erase();
                state = read_vlc;
            }
            break;
        case read_vlc:
            // append 0 and 1 to code
            if ( c == '0' || c == '1' )
                code += c;
            // terminate code on a tab
            else if ( c == '\t' )
```

APPENDIX I-continued

Copyright © 2001–2002 Enroute Inc.
All Rights Reserved

```
                {
                    state = skip_to_data;
                }
                // allow embedded spaces but no other characters
                else if ( c != ' ' )
                {
                cerr << "parse error at line " << line << "\n";
                    state = error;
                }
                break;
            case skip_to_data:
                // continue in this state until non-whitespace
                if ( !isspace(c) )
                {
                // read this character again in the next state
                    cin.putback(c);
                    state = read_data;
                }
                break;
            case read_data:
                // append everything up to the newline
                if ( c != '\n' )
                    data += c;
                else
                {
                    // count zeros
                    const int zeros = count_leading_zeros(code);
                    // check for all zero
                    if ( zeros == code.length() )
                        allzero = true;
                    // validate the size of the code array
                    if ( zeros >= codearray.size() )
                        codearray.resize(zeros + 1,0);
                    // create a map if necessary
                    if ( !codearray[zeros] )
                        codearray[zeros] = new CodeList;
                    // add the entry to the map
                codearray[zeros]->push_back(CodeEntry(code,data));
                    if ( code.length() > longest )
                        longest = code.length();
                    state = skip_to_vlc;
                }
                break;
        }
    }
    if ( state != skip_to_vlc )
    {
        cerr << "unexpected parse termination at line " << line << "\n";
        exit(-1);
    }
    cout << "// Read " << longest << " bits from input (inbits).\n";
    if ( allzero )
        cout << "// Shift a 1 into the LSB.\n";
    cout << "// Find index of most significant 1 bit.\n";
    cout << "// Look up offset and shift in " << tablename << "_0.\n";
    cout << "// Value is " << tablename << "_1[offset + (inbits >> shift)].\n";
ofstream log("log.txt");
log << "LongestCode = " << longest << endl;
    // build tables
    TableList table;
    int nEntries = 0;
    cout << "TABLE1_TYPE " << tablename << "_1[] = {\n";
    for ( int i = longest - (allzero ? 0 : 1); i >= 0; --i )
    {
log << "MSBIndex = " << i << endl;
        // skip empty maps
        if ( i >= codearray.size() || !codearray[i] )
        {
            table.push_back(TableEntry(0,0));
            continue;
        }
        // search for maximum length code
```

APPENDIX I-continued

Copyright © 2001–2002 Enroute Inc.
All Rights Reserved

```
        int max_length = 0;
        for ( CodeList::const_iterator j = codearray[i]—>begin(); j
!= codearray[i]—>end(); ++j )
        {
            const int length = j—>code.length();
            max_length = length > max_length ? length : max_length;
        }
        // determine maximum and minimum values
        int min_value = numeric_limits<int>::max();
        int max_value = 0;
        for ( j = codearray[i]—>begin(); j != codearray[i]—>end();
++j )
        {
            const int zvalue = extended_zero(j—>code,max_length);
            const int ovalue = extended_one(j—>code,max_length);
            min_value = zvalue < min_value ? zvalue : min_value;
            max_value = ovalue > max_value ? ovalue : max_value;
        }
        // add an entry to table_0
        // Add one to shift to take care of the extra bit.
        table.push_back(
            TableEntry(
                nEntries - min_value,
                longest - max_length + (allzero ? 1 : 0)));
        // output table
        for ( int k = min_value; k <= max_value; ++k )
        {
            // build binary string from value
            const string s = binary_to_string(k,max_length);
            // look up the matching code
            CodeList::const_iterator entry = find_if(codearray[i]—
>begin(),codearray[i]—>end(),CodeMatch(s));
            // output the code data
            if ( entry != codearray[i]—>end() )
                cout << "\t" << entry—>data << ",\t// "
                    << entry—>code
                    << "(" << s.substr(entry—>code.length()) << ")"
                    << "\n";
            else
                cout << "\tNO_MATCH,\t// "
                    << s << "\n";
            // increment the number of table entries
            ++nEntries;
        }
    }
    cout << "};\n\n";
    cout << "TABLE0_TYPE " << tablename << "_0[] = {\n";
    cout << "\t// TABLE0(offset, shift),\n";
    // output table
    for ( TableList::const_iterator entry = table.begin(); entry !=
table.end(); ++entry )
        cout << "\tTABLE0( " << entry—>offset << ", " << entry—>shift
<< " ),\n";
    cout << "};\n";
    return 0;
}
```

What is claimed is:

1. A method of decoding a binary input string encoded using a variable length code; the method comprising:
   reading a first subset of leading bits from the binary input string;
   calculating an offset index value for an offset lookup table;
   retrieving an offset value from the offset lookup table;
   calculating a symbol index value for a symbol lookup table, wherein the symbol index value is based on the offset value and a second subset of leading bits from the binary input string; and
   retrieving a symbol corresponding to a codeword formed by a third subset of leading bits from the binary input string.

2. The method of claim 1, wherein the calculating an offset index value for an offset lookup table comprises calculating the most significant bit position of a binary state of the first subset of leading bits.

3. The method of claim 2, wherein the binary state is 1.

4. The method of claim 2, wherein the binary state is 0.

5. The method of claim 1, wherein the calculating an offset index value for an offset lookup table comprises calculating a number of leading zeros in the first subset of leading bits.

6. The method of claim 1, wherein the calculating an offset index value for an offset lookup table comprises calculating a number of leading ones in the first subset of leading bits.

7. The method of claim 1, further comprising retrieving a subset size of the second subset of leading bits from the offset lookup table.

8. The method of claim 1, wherein the symbol index value is equal to the offset value plus an integer value of the second subset of leading bits.

9. The method of claim 1, further comprising
retrieving a shift value from the offset lookup table; and
shifting the first subset of leading bits by the shift value to create the second subset of leading bits.

10. The method of claim 1, further comprising retrieving a subset size of the codeword.

11. The method of claim 1, further comprising consuming the codeword from the binary input string.

12. The decoder of claim 1, further comprising
means for retrieving a shift value from the offset lookup table; and
means for shifting the first subset of leading bits by the shift value to create the second subset of leading bits.

13. The decoder of claim 1, further comprising means for retrieving a subset size of the codeword.

14. The decoder of claim 1, further comprising means for consuming the codeword from the binary input string.

15. A decoder for a binary input string encoded by a variable length encoder, the decoder comprising:
an input buffer coupled to receive the binary input string;
an offset index calculation unit coupled to the input buffer;
an offset lookup table coupled to the offset index calculation unit; and
a symbol lookup table coupled to the offset lookup table.

16. The decoder of claim 15, wherein the offset index calculation unit is configured to generate an offset index value for the offset lookup table.

17. The decoder of claim 16, wherein the offset index value is used to index the offset lookup table to generate an offset value.

18. The decoder of claim 15, further comprising:
an adder coupled between the offset lookup table and the symbol lookup table, wherein the adder is configured to generate a symbol index value for the symbol lookup table; and
a binary to integer unit coupled to the input buffer, the adder, and the offset lookup table.

19. The decoder of claim 18, wherein the binary to integer unit is configured to generate an integer value based on a second subset of leading bits and wherein the adder adds the integer value to an offset value from the offset lookup table to generate the symbol index value.

20. The decoder of claim 19, wherein the size of the second subset is provided by the offset lookup table.

21. The decoder of claim 15, wherein the offset index calculation unit is a most significant bit position calculation unit.

22. The decoder of claim 15, wherein the offset index calculation unit is a leading zeros calculation unit.

23. The decoder of claim 15, wherein the offset index calculation unit is a leading ones calculation unit.

24. The decoder of claim 15, wherein the offset lookup table and the symbol lookup table are stored in a memory system of a computer.

25. A decoder of decoding a binary input string encoded using a variable length code; the decoder comprising:
means for reading a first subset of leading bits from the binary input string;
means for calculating an offset index value for an offset lookup table;
means for retrieving an offset value from the offset lookup table;
means for calculating a symbol index value for a symbol lookup table, wherein the symbol index value is based on the offset value and a second subset of leading bits from the binary input string; and
means for retrieving a symbol corresponding to a codeword formed by a third subset of leading bits from the binary input string.

26. The decoder of claim 25, wherein the means for calculating an offset index value for an offset lookup table comprises means for calculating the most significant bit position of a binary state of the first subset of leading bits.

27. The decoder of claim 25, wherein the means for calculating an offset index value for an offset lookup table comprises means for calculating a number of leading zeros in the first subset of leading bits.

28. The decoder of claim 25, wherein the means for calculating an offset index value for an offset lookup table comprises means for calculating a number of leading ones in the first subset of leading bits.

29. The decoder of claim 25, further comprising means for retrieving a subset size of the second subset of leading bits from the offset lookup table.

30. The decoder of claim 25, wherein the symbol index value is equal to the offset value plus an integer value of the second subset of leading bits.

* * * * *